(12) United States Patent
Brunco

(10) Patent No.: US 9,257,557 B2
(45) Date of Patent: Feb. 9, 2016

(54) SEMICONDUCTOR STRUCTURE WITH SELF-ALIGNED WELLS AND MULTIPLE CHANNEL MATERIALS

(71) Applicant: GLOBALFOUNDRIES Inc., Grand Cayman, KY (US)

(72) Inventor: David P. Brunco, Latham, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 2 days.

(21) Appl. No.: 14/282,463

(22) Filed: May 20, 2014

(65) Prior Publication Data

US 2015/0340500 A1   Nov. 26, 2015

(51) Int. Cl.
| | | |
|---|---|---|
| *H01L 21/8238* | (2006.01) | |
| *H01L 29/78* | (2006.01) | |
| *H01L 21/762* | (2006.01) | |
| *H01L 21/02* | (2006.01) | |
| *H01L 21/265* | (2006.01) | |

(52) U.S. Cl.
CPC ...... *H01L 29/7849* (2013.01); *H01L 21/02532* (2013.01); *H01L 21/26513* (2013.01); *H01L 21/76224* (2013.01)

(58) Field of Classification Search
CPC ..................... H01L 29/7849; H01L 21/02532; H01L 21/26513; H01L 21/76224
USPC ................. 438/218, 221, 229; 257/E21.409, 257/E21.441
See application file for complete search history.

(56) References Cited

U.S. PATENT DOCUMENTS

| | | | | |
|---|---|---|---|---|
| 5,847,419 A | * | 12/1998 | Imai ................. | H01L 27/0605 257/190 |
| 6,906,400 B2 | | 6/2005 | Delhougne et al. | |
| 2002/0197803 A1 | * | 12/2002 | Leitz ............... | H01L 21/823807 438/285 |
| 2004/0192069 A1 | | 9/2004 | Bedell et al. | |
| 2005/0224797 A1 | * | 10/2005 | Ko ................. | H01L 21/76264 257/64 |
| 2015/0263097 A1 | * | 9/2015 | Cheng ............ | H01L 29/165 257/192 |

* cited by examiner

*Primary Examiner* — Robert Huber
(74) *Attorney, Agent, or Firm* — Williams Morgan, P.C.

(57) ABSTRACT

Embodiments of the present invention provide a semiconductor structure having a strain relaxed buffer, and method of fabrication. A strain relaxed buffer is disposed on a semiconductor substrate. A silicon region and silicon germanium region are disposed adjacent to each other on the strain relaxed buffer. An additional region of silicon or silicon germanium provides quantum well isolation.

11 Claims, 14 Drawing Sheets

SEMICONDUCTOR STRUCTURE WITH SELF-ALIGNED WELLS AND MULTIPLE CHANNEL MATERIALS

FIELD OF THE INVENTION

The present invention relates generally to semiconductor fabrication, and more particularly, to semiconductor structures with self-aligned wells and multiple channel materials.

BACKGROUND

A compressive stress or tensile stress can be applied to some types of transistors to increase their performance. For standard orientation Si wafers, the performance of a p-type field effect transistor (pFET) improves when a longitudinal (in the direction of current flow) compressive stress is applied to the channel region. On the other hand, the performance of an n-type field effect transistor (nFET) improves when a longitudinal tensile stress is applied to the channel region. Additionally, for heterostructures comprising different channel materials on an underlying structure, it is favorable to have a quantum barrier between the channel material and underlying structure to help confine carriers to the channel and thus reduce off-state leakage. When nFET devices and pFET devices are used together in a complementary metal oxide semiconductor (CMOS) structure, it is desirable to apply the appropriate type of stress for each device and to achieve the appropriate quantum barrier offset.

SUMMARY

Embodiments of the present invention provide an improved semiconductor structure and method of fabrication. A strain relaxed buffer (SRB) is disposed on a semiconductor substrate. A silicon region and silicon germanium region are disposed adjacent to each other on the strain relaxed buffer. An additional region of silicon or silicon germanium between the SRB and the silicon region and/or silicon germanium region on the SRB may be used to provide additional quantum well isolation.

In a first aspect, embodiments of the present invention provide a method of forming a semiconductor structure, comprising: forming an n-doped, stress relaxed epitaxial first silicon germanium layer having a first germanium concentration onto a semiconductor substrate; depositing a compressively strained epitaxial second silicon germanium layer having a second germanium concentration onto the first silicon germanium layer, wherein the second germanium concentration is higher than the first germanium concentration; removing a portion of the second silicon germanium layer over a first region to create exposed regions of the first silicon germanium layer, while preserving a portion of the second silicon germanium layer over a second region; counterdoping to p-type the exposed regions of the first silicon germanium layer that are not covered by the second silicon germanium layer; selectively depositing a tensile strained, epitaxial silicon layer in the first region; and forming a plurality of shallow trench isolation regions in the first region and the second region of the second silicon germanium layer.

In a second aspect, embodiments of the present invention provide a method of forming a semiconductor structure, comprising: forming a p-doped, stress relaxed epitaxial first silicon germanium layer having a first germanium concentration onto a semiconductor substrate; depositing a tensile strained epitaxial second silicon germanium layer having a second germanium concentration onto the first silicon germanium layer, wherein the second germanium concentration is lower than the first germanium concentration; removing a portion of the second silicon germanium layer over a first region to create exposed regions of the first silicon germanium layer, while preserving a portion of the second silicon germanium layer over a second region; counterdoping to n-type the exposed regions of the first silicon germanium layer that are not covered by the second silicon germanium layer; selectively depositing a compressively strained, epitaxial third silicon germanium layer in the first region, the third silicon germanium layer having a third germanium concentration that is higher than the first germanium concentration; and forming a plurality of shallow trench isolation regions in the first region and the second region of the second silicon germanium layer.

In a third aspect, embodiments of the present invention provide a method of forming a semiconductor structure, comprising: forming a stress relaxed epitaxial first silicon germanium layer doped with a first dopant species and having a first germanium concentration onto a semiconductor substrate; depositing a second silicon germanium layer on the first silicon germanium layer and having a second germanium concentration; forming shallow trench isolation regions in the first and second silicon germanium layers; removing a portion of the second silicon germanium layer over a first region to create exposed regions of the first silicon germanium layer, while preserving a portion of the second silicon germanium layer over a second region; counterdoping the exposed regions of the first silicon germanium layer that are not covered by the second silicon germanium layer with dopants opposite in polarity to the first dopant species; and depositing a third silicon germanium layer over the first silicon germanium layer in the first region and having a third germanium concentration.

In a fourth aspect, embodiments of the present invention provide a method of forming a semiconductor structure, comprising: forming a stress relaxed epitaxial first silicon germanium layer doped with a first dopant species and having a first germanium concentration onto a semiconductor substrate; forming shallow trench isolation regions in the first silicon germanium layer; removing a portion of the first silicon germanium layer over a first region; depositing a second silicon germanium layer over the first silicon germanium layer in the first region and having a second germanium concentration; removing a portion of the first silicon germanium layer over a second region to create exposed regions of the first silicon germanium layer; counterdoping the exposed regions of the first silicon germanium layer that are not covered by the second silicon germanium layer with dopants opposite in polarity to the first dopant species; and depositing a third silicon germanium layer over the first silicon germanium layer in the second region and having a third germanium concentration.

In a fifth aspect, embodiments of the present invention provide a semiconductor structure comprising: a semiconductor substrate; a first silicon germanium layer having a first germanium concentration disposed on the semiconductor substrate, wherein the first silicon germanium layer comprises p-type dopants in a first region, and wherein the first silicon germanium layer comprises n-type dopants in a second region; a tensile strained silicon layer disposed over the first region of the first silicon germanium layer; a compressively strained second silicon germanium layer disposed over second region of the first silicon germanium layer and having a second germanium concentration higher than the first germanium concentration; a plurality of shallow trench isolation regions formed in the second silicon germanium layer and silicon layer.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1A:
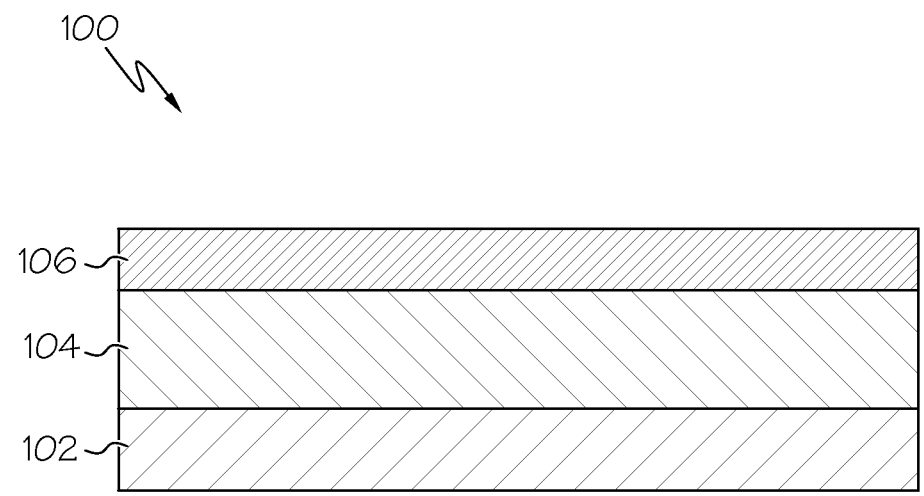

In some cases, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIGS. 1A-1F show process steps for forming a semiconductor structure having a strain relaxed buffer in accordance with embodiments of the present invention.

FIGS. 2A-2F show process steps for forming a semiconductor structure having a strain relaxed buffer in accordance with additional embodiments of the present invention.

FIGS. 3A-3F show process steps for forming a semiconductor structure having a strain relaxed buffer in accordance with additional embodiments of the present invention.

FIGS. 4A-4D show process steps for forming a semiconductor structure having a strain relaxed buffer in accordance with additional embodiments of the present invention.

FIGS. 5A-5F show process steps for forming a semiconductor structure having a strain relaxed buffer in accordance with additional embodiments of the present invention.

DETAILED DESCRIPTION

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g., a second layer), wherein intervening elements, such as an interface structure (e.g., interface layer), may be present between the first element and the second element.

FIGS. 1A-1F show process steps for forming a semiconductor structure having a strain relaxed buffer in accordance with embodiments of the present invention. Referring now to FIG. 1A, a semiconductor structure 100 at a starting point for embodiments of the present invention is shown. Semiconductor structure 100 comprises a semiconductor substrate 102. In embodiments, semiconductor substrate 102 may comprise a bulk silicon substrate such as a silicon wafer. Disposed on substrate 102 is strain relaxed buffer (SRB) 104. In embodiments, SRB 104 is comprised of silicon germanium (SiGe), and in particular, is of the composition Si(1−x)Gex, where x is a number ranging from 0 to 1, indicating the atomic percentage of germanium. For example, Si0.75Ge0.25 corresponds to a silicon germanium compound with 25 percent germanium. In embodiments, the percentage of germanium for SRB 104 may range from about 15 percent to about 75 percent, and more preferably between about 20 and about 50 percent. In embodiments, SRB 104 is n doped. In embodiments, the dopant species may include, but is not limited to, phosphorous, arsenic, and/or antimony. The doping may be in situ during epitaxial growth or subsequently (e.g., ion implant). An optional anneal may be used to provide more homogeneous doping and/or to reduce damage or dislocations. Co-doping of additional species, e.g., C, may be used to suppress subsequent diffusion of electrically active dopant atoms. Disposed on the SRB 104 is another silicon germanium layer 106. In embodiments, silicon germanium layer 106 has a higher germanium concentration than SRB 104. This results in both a mobility boost from compressive channel strain and a desirable quantum well for the carriers in the channel for a pFET device. In embodiments, the percentage of germanium for silicon germanium layer 106 is about 20 to about 40 percent higher than that of the SRB 104. For example, if the SRB is 25 percent germanium, then the silicon germanium layer 106 may range from about 45 percent to about 65 percent. As a specific example, a Si0.50Ge0.50 channel on a Si0.75Ge0.25 SRB results in a favorable valence band offset of approximately 170 meV.

Figure 1B:
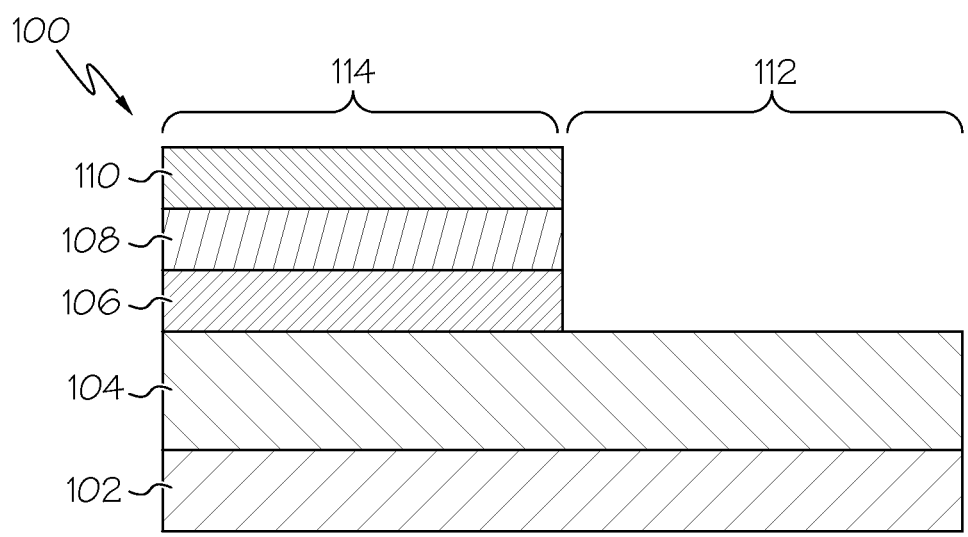

FIG. 1B shows semiconductor structure 100 after subsequent process steps of applying a hardmask 108, and photoresist 110, and then patterning the structure 100 into two regions, a first region 112 and a second region 114. As a result of the patterning, an exposed region of the SRB 104 is formed in first region 112. In embodiments, the hardmask 108 may comprise silicon oxide (SiO2), silicon nitride (SiN), silicon oxynitride (SiON), and/or amorphous carbon, or may comprise of a stack of one or more such materials, or additional layers (not shown) required for lithography. The first region 112 and second region 114 will become complementary regions, e.g., nFET and pFET, during subsequent process steps. The silicon germanium layer 106 is removed from the first region 112, exposing the SRB 104 in that region, while the silicon germanium layer 106 is preserved in the second region 114. While FIG. 1B utilizes conventional lithographic techniques to transfer the pattern from mask to the wafer, more advanced double patterning techniques may be required, especially for advanced nodes with small feature size and pitch.

Figure 1C:
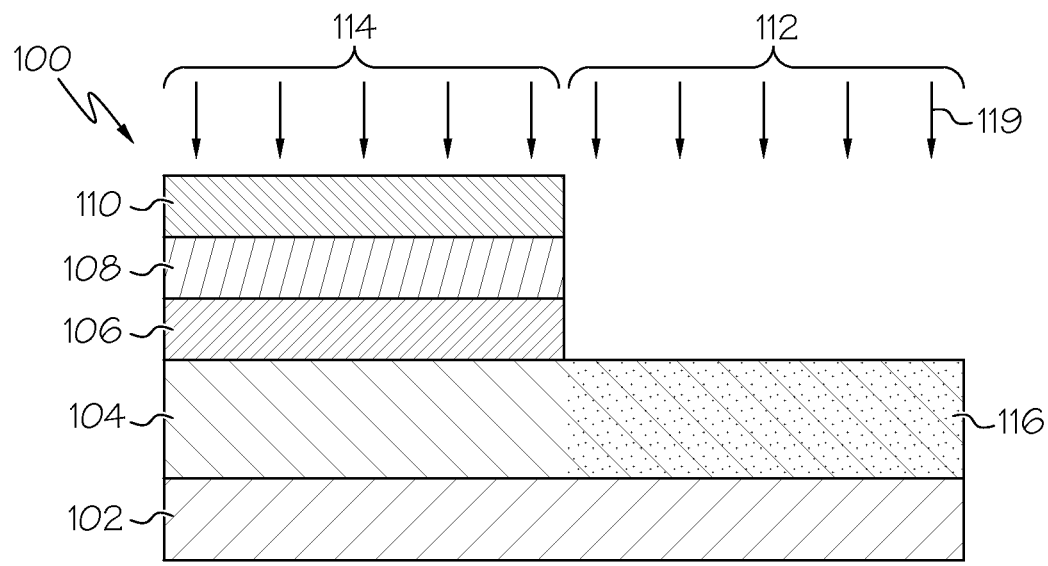

FIG. 1C shows semiconductor structure 100 after subsequent process steps of applying p-type dopants via ion implantation (indicated by arrows 119), and removing the photoresist from the second region 114. As a result, a p-type SRB region 116 is formed in first region 112, while the portion of SRB 104 in the second region 114 remains as an n-type region. In embodiments, the ion implantation species comprises boron. The dopant dosage is preferably sufficient to counterdope the original doping in the SRB (104). While for other applications counterdoping may be undesirable, it may provide some benefits for the SRB (104) in embodiments of the present invention. Namely, counterdoping typically results in lower mobility as a result of additional scattering from dopant atoms. In these embodiments, this may be beneficial, as the SRB 104 is below the channel and current flow in the SRB is undesirable.

Figure 1D:
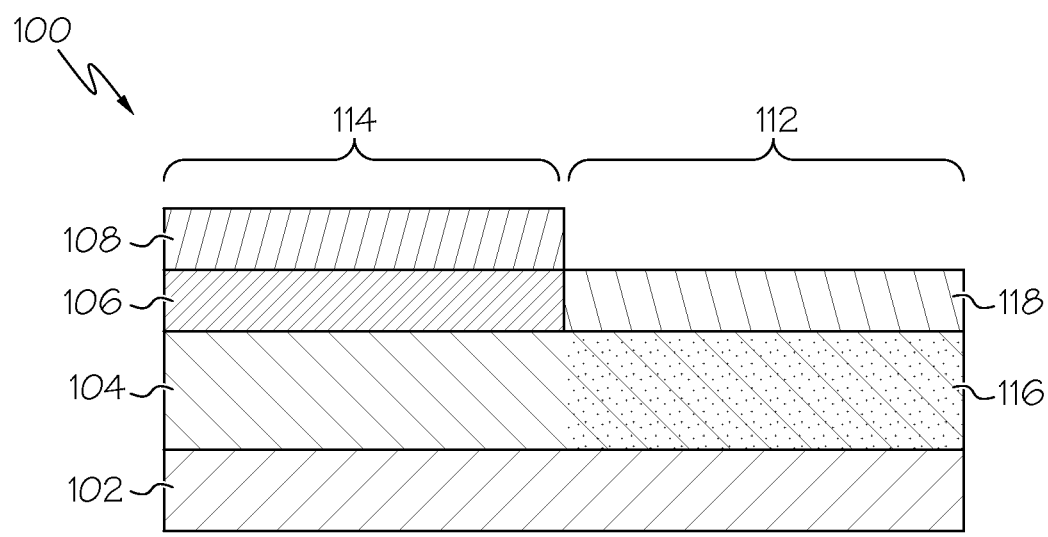
Figure 1E:
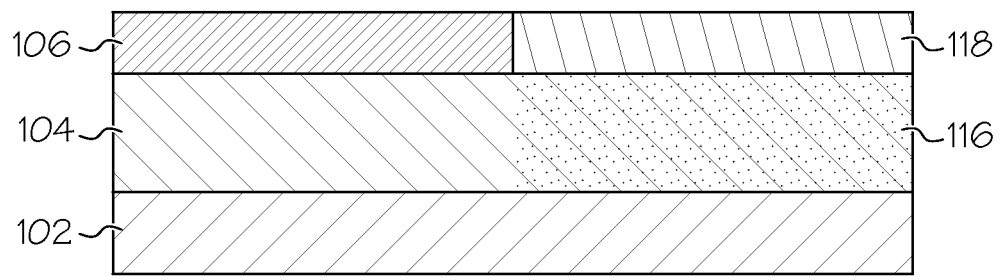

FIG. 1D shows semiconductor structure 100 after a subsequent process step of removing the photoresist 110, and depositing a layer comprising predominantly silicon 118. In embodiments, the silicon layer 118 is epitaxially grown selectively on silicon or silicon germanium. FIG. 1E shows structure 100 after a subsequent process step of removing the hardmask 108. The silicon layer 118 will serve as the nFET channel material and has the advantage of tensile longitudinal stress, as a result of being epitaxially grown on the SiGe SRB 104. Additionally, this structure provides a favorable conduction band offset between the silicon 118 nFET channel layer and the underlying SiGe SRB 104. As a specific example, a Si channel on a Si0.75Ge0.25 SRB results in a favorable conduction band offset of approximately 130 meV. Optionally, a planarization process, such as a chemical mechanical polish (CMP) process may be performed after the removal of the hardmask 108. This provides a smooth, approximately coplanar surface for both the first semiconducting channel material (silicon nFET region 118) and second semiconducting channel material (SiGe pFET region 106).

The surface preparation immediately prior to epitaxial growth of the second semiconducting channel material (silicon layer 118) may remove some of the hardmask 108, exposing the top of the first semiconducting channel material (silicon germanium layer 106) at the upper corner 106a. This can result in undesired growth of the second semiconducting channel material (silicon layer 118) on top of the first semiconducting channel material (silicon germanium layer 106) at the corner. Embodiments of the present invention mitigate this issue with a short etch of the exposed first semiconducting layer (silicon germanium layer 106) prior to the deposition of the second semiconducting channel layer (silicon layer 118). In embodiments, this short etch is performed using HCl vapor at an elevated temperature.

Figure 1F:
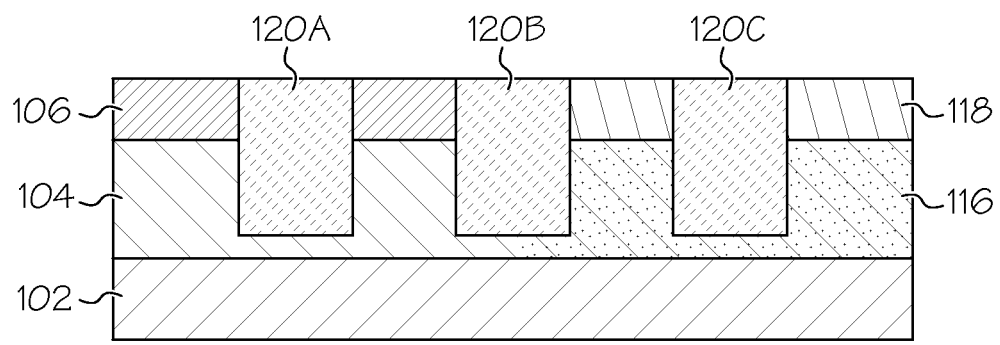

FIG. 1F shows semiconductor structure 100 after subsequent process steps of patterning shallow trench cavities, and filling the shallow trench cavities with a dielectric layer to form shallow trench isolation (STI) regions 120A, 120B, and 120C. The STI regions serve to provide isolation for adjacent devices. The patterning of some of the STI features can be chosen to coincide with transition region between nMOS and pMOS such that this transition region is eliminated. From this point forward, industry standard techniques may be used to form an integrated circuit. These techniques may include sidewall image transfer (SIT) or other advanced patterning techniques to form fins, replacement metal gate (RMG) techniques to form gates, back end of line (BEOL) steps to provide via and metallization connectivity, and packaging.

The aforementioned embodiment provides many benefits in the required growth of the epitaxial films. First, a single fabrication of an unpatterned stress relaxed buffer 104 can be used for both nFET and pFET devices. Second, the silicon germanium layer 106 for the pFET can also be deposited on unpatterned wafers, eliminating the role of pattern density and topography on the deposition. Furthermore, comparatively simpler, higher throughput non-selective epitaxial processes may be used for layers 104 and 106. Third, the epitaxial deposition of the silicon 118 nMOS is on comparatively large areas as compared to those for replacement fin approaches, where the very narrow lines (<20 nm) can result in lots of defects at the sidewalls where the epitaxial layer contacts the STI oxide. Furthermore, this deposition is of a single element (Si), which can be done with much higher throughput and typically of higher quality than selective depositions of alloys, e.g. SiGe in highly confined spaces.

The aforementioned embodiment provides many benefits beyond simply epitaxial growth considerations in the required growth of the epitaxial films. First, the n-well doping for the SiGe can be done without patterning. As a note, additional patterned well implants may be performed if desired. Second, the aforementioned integration flow results in wells that are self-aligned to the channel epitaxial regions. Hence, region 116 is aligned (directly underneath) with region 118, and region 106 is aligned (directly underneath) with region 104. Third, the nFET channel region comprises predominantly silicon as the semiconducting material, but can contain small amount of dopants, and other elements, including other group IV elements such as C and Ge. A clear advantage of using predominantly silicon 118 for nMOS is that it is a material familiar to the industry, with a high degree of maturity. The advantage of forming the silicon nMOS on a SiGe SRB 104, as compared to simply monolithic on a silicon substrate, is the additional tensile stress achieved and the quantum well offset.

Note that while the aforementioned steps show starting with an n-doped SRB, embodiments of the present invention may be performed with opposite polarity, using methods similar to that described in the text for FIG. 1. For example, instead of the silicon germanium SRB 104 being n-doped, a p-doped silicon germanium SRB is formed. Also, the epitaxial layer 104 would be silicon instead of silicon germanium to achieve the correct sign for the conduction band offset for an nFET device. After patterning, n-type dopants such as phosphorus, arsenic, and/or antimony would then be used for counterdoping 119. As a result, an n-type SRB region 116 is formed in first region 112, while the portion of SRB 104 in the second region 114 remains as p-type. Here, the first region 112 and second region 114 will become complementary regions, respectively pFET and nFET, during subsequent process steps. In embodiments, a silicon germanium layer 118 having a higher germanium concentration than the SRB 104 is formed by a selective epitaxial process on top of n-type SRB region 116. This results in both a mobility boost from compressive channel strain and a desirable quantum well for the carriers in the channel for a pFET device. Other details for this structure where the structure starts with an n-doped SRB is analogous to the previous, more detailed description where we start with a p-doped SRB, but with modifications per industry standard techniques and what is taught in embodiments of this disclosure.

Figure 2A:
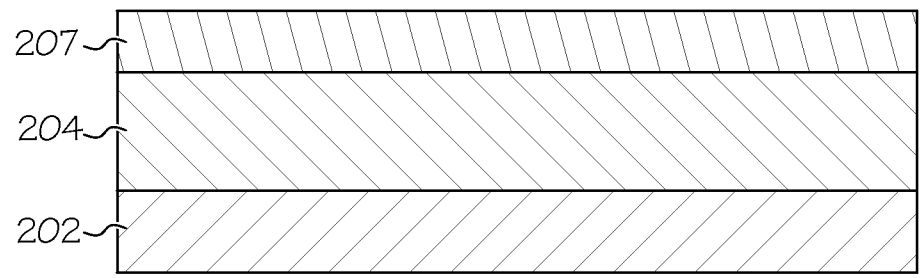

FIGS. 2A-2F show process steps for forming a semiconductor structure having a strain relaxed buffer in accordance with additional embodiments of the present invention. Referring now to FIG. 2A, a semiconductor structure 200 at a starting point for embodiments of the present invention is shown. Semiconductor structure 200 comprises a semiconductor substrate 202. In embodiments, semiconductor substrate 202 may comprise a bulk silicon substrate such as a silicon wafer. Disposed on substrate 202 is strain relaxed buffer (SRB) 204. In embodiments, SRB 204 is comprised of silicon germanium (SiGe). In embodiments, the percentage of germanium for SRB 204 may range from about 15 percent to about 75 percent, and more preferably between about 20 and about 50 percent. In embodiments, SRB 204 is p doped. In embodiments, the dopant species may include boron. Disposed on the SRB 204 is another silicon layer 207.

Figure 2B:
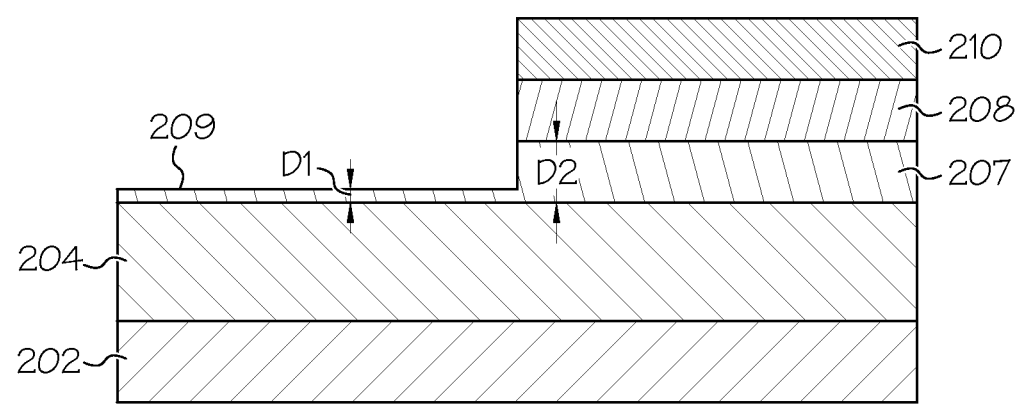

FIG. 2B shows semiconductor structure 200 after subsequent process steps of applying a hardmask 208 and photoresist 210, and then patterning the structure 200 into two regions, a first region 212 and a second region 214. In embodiments, the hardmask 208 may comprise silicon oxide or silicon nitride. These regions will become complementary regions (pFET/nFET) during subsequent process steps. The silicon layer 207 is then recessed from the second region 112, resulting in thinner silicon layer 209 having a thickness of D1, while the silicon layer 207 in region 212 remains with a thickness of D2. In embodiments, D1 ranges from about 2 nanometers to about 10 nanometers. In embodiments, D2 ranges from about 20 nanometers to about 60 nanometers.

Figure 2C:
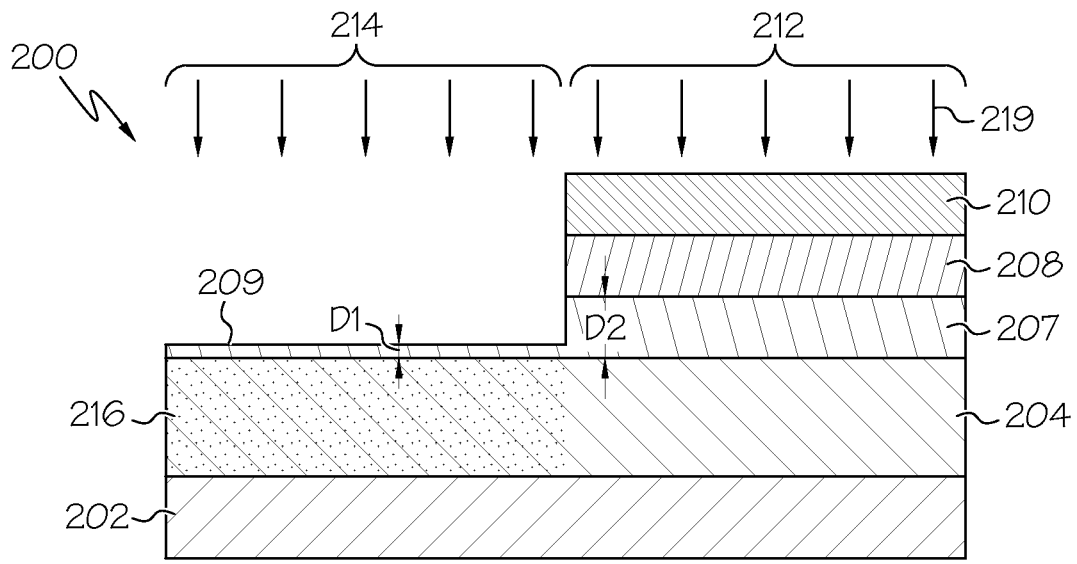

FIG. 2C shows semiconductor structure 200 after subsequent process steps of applying n-type dopants via ion implantation (indicated by arrows 219), and removing the photoresist from the first region 212. As a result, an n-type SRB region 216 is formed in second region 214, while the portion of SRB 204 in the first region 212 remains as a p-type region. In embodiments, the ion implantation species comprises arsenic, phosphorous, and/or antimony.

Figure 2D:
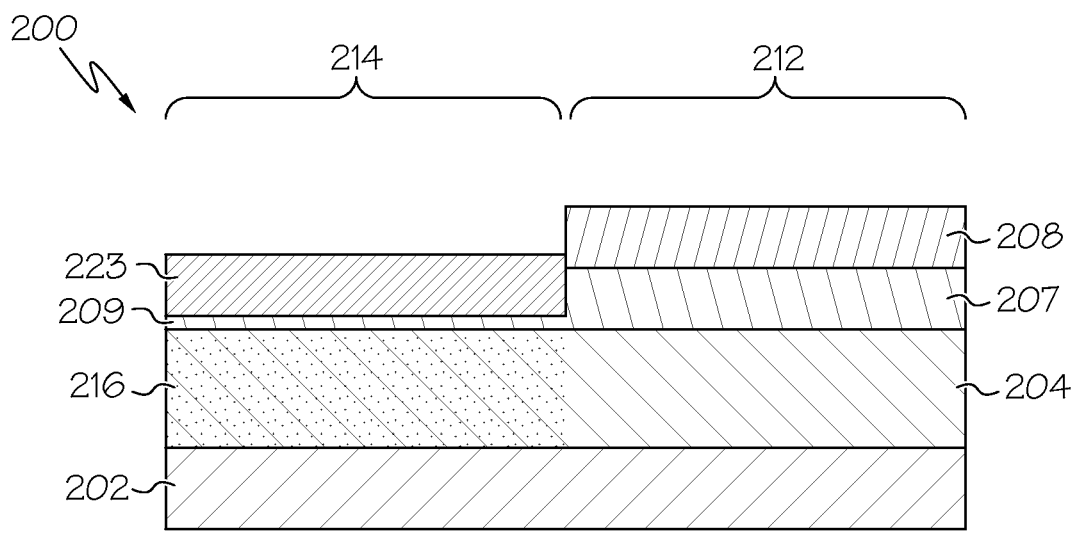
Figure 2E:
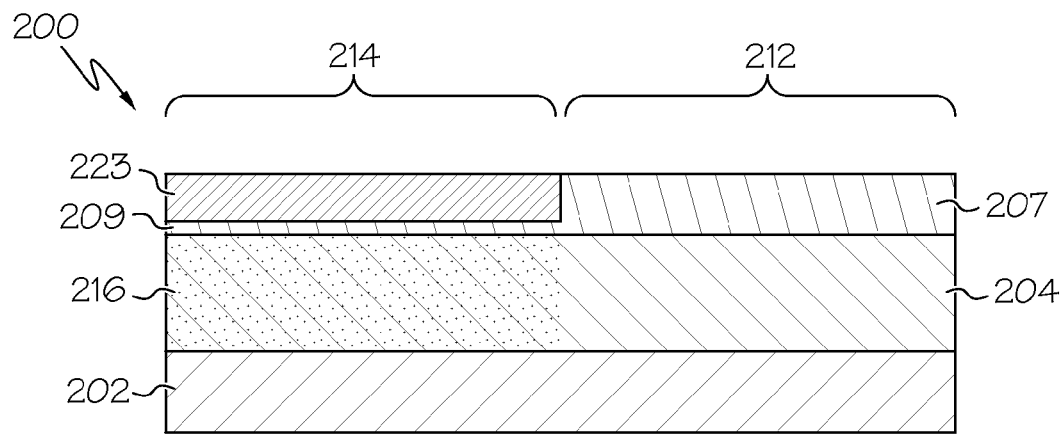

FIG. 2D shows semiconductor structure 200 after a subsequent process step of removing the photoresist 210, and depositing another silicon germanium layer 223. In embodiments, silicon germanium layer 223 has a higher germanium concentration than SRB 204. In embodiments, the percentage of germanium for silicon germanium layer 223 may range from about 20 to about 40 percent higher than that of the SRB. FIG. 2E shows structure 200 after a subsequent process step of removing the hardmask 208.

Figure 2F:
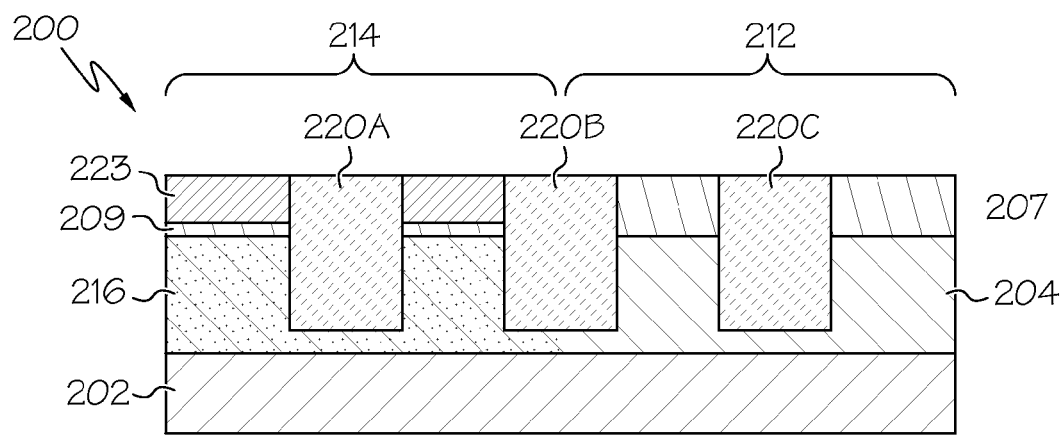

FIG. 2F shows semiconductor structure 200 after subsequent process steps of patterning shallow trench cavities, and filling the shallow trench cavities with a dielectric layer to form shallow trench isolation (STI) regions 220A, 220B, and 220C. The STI regions serve to provide isolation for adjacent devices. The thin layer of silicon 209 in the second region 214 serves as an additional quantum well isolation benefit and also permits the surface preparation prior to the formation of SiGe layer 223 to be a simple HF preclean and/or a conventional H2 prebake on a silicon surface. Optionally, dopant diffusion barriers, such as the addition of carbon atoms to the bottom of the silicon region 207 or near the top of the SRB 204 may be used. From this point forward, industry standard techniques may be used to form an integrated circuit. These techniques may include sidewall image transfer (SIT) techniques or other advanced patterning techniques to form fins, replacement metal gate (RMG) techniques to form gates, back end of line (BEOL) steps to provide via and metallization connectivity, and packaging.

Figure 3A:
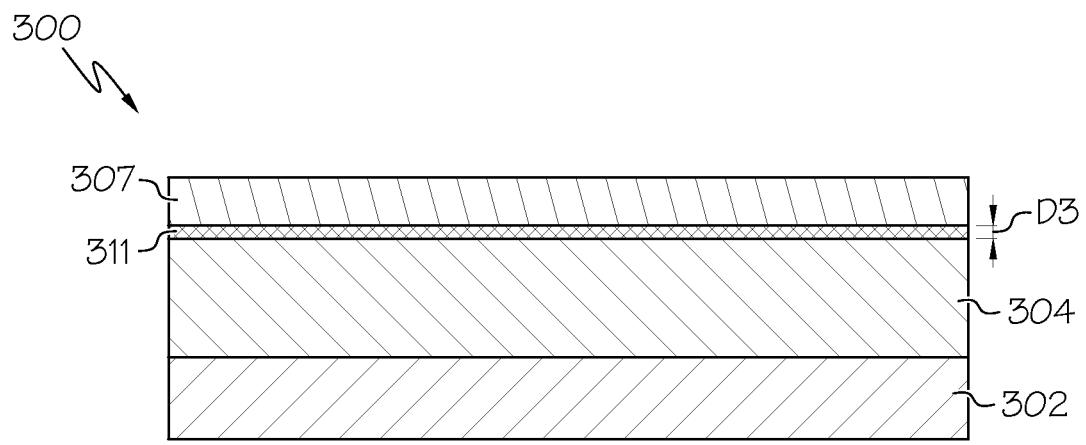

FIGS. 3A-3F show process steps for forming a semiconductor structure having a strain relaxed buffer in accordance with additional embodiments of the present invention. Referring now to FIG. 3A, a semiconductor structure 300 at a starting point for embodiments of the present invention is shown. Semiconductor structure 300 comprises a semiconductor substrate 302. In embodiments, semiconductor substrate 302 may comprise a bulk silicon substrate such as a silicon wafer. Disposed on substrate 302 is strain relaxed buffer (SRB) 304. In embodiments, SRB 304 is comprised of silicon germanium (SiGe). In embodiments, the percentage of germanium for SRB 304 may range from about 15 percent to about 75 percent, and more preferably between about 20 and about 50 percent. In embodiments, SRB 304 is p doped. In embodiments, the dopant species may include boron. Disposed on the SRB 304 is another silicon germanium layer 311. Silicon germanium layer 311 has a higher germanium concentration than SRB 304. In embodiments, the percentage of germanium for silicon germanium layer 311 may range from about 60 percent to about 80 percent. In other embodiments, the percentage of germanium for silicon germanium layer 311 may range from about 10 percent to about 50 percent higher than that of SRB 304. Silicon germanium layer 311 has a thickness of D3. In embodiments, D3 ranges from about 2 nanometers to about 10 nanometers. Silicon layer 307 is disposed on silicon germanium layer 311.

Figure 3B:
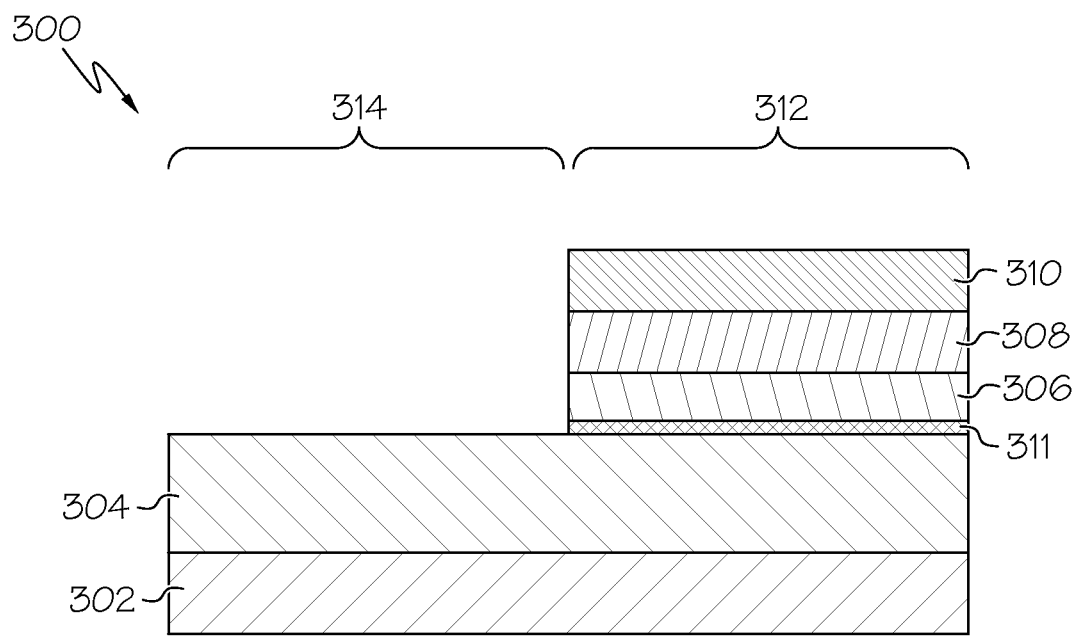

FIG. 3B shows semiconductor structure 300 after subsequent process steps of applying a hardmask 308, and photoresist 310, and then patterning the structure 300 into two regions, a first region 312 and a second region 314. As a result of the patterning, an exposed region of the SRB 304 is formed in region 314. Within region 312, the remaining portion of layer 307 (FIG. 3A) is now indicated as 306 in FIG. 3B. In embodiments, the hardmask 308 may comprise silicon oxide or silicon nitride. These regions will become complementary regions (pFET/nFET) during subsequent process steps. The silicon germanium layer 311 is removed from the second region 314, exposing the SRB 304 in that region.

Figure 3C:
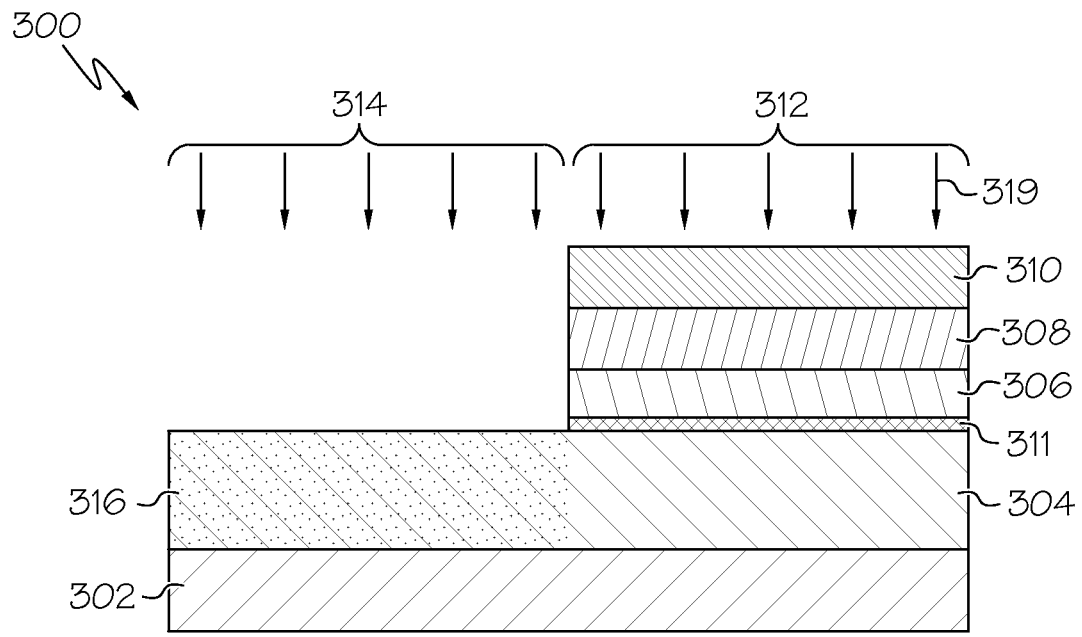

FIG. 3C shows semiconductor structure 300 after subsequent process steps of applying n-type dopants via ion implantation (indicated by arrows 319), and removing the photoresist from the first region 312. As a result, an n-type SRB region 316 is formed in second region 314, while the portion of SRB 304 in the first region 312 remains as a p-type region. In embodiments, the ion implantation species comprises arsenic, phosphorous, and/or antimony.

Figure 3D:
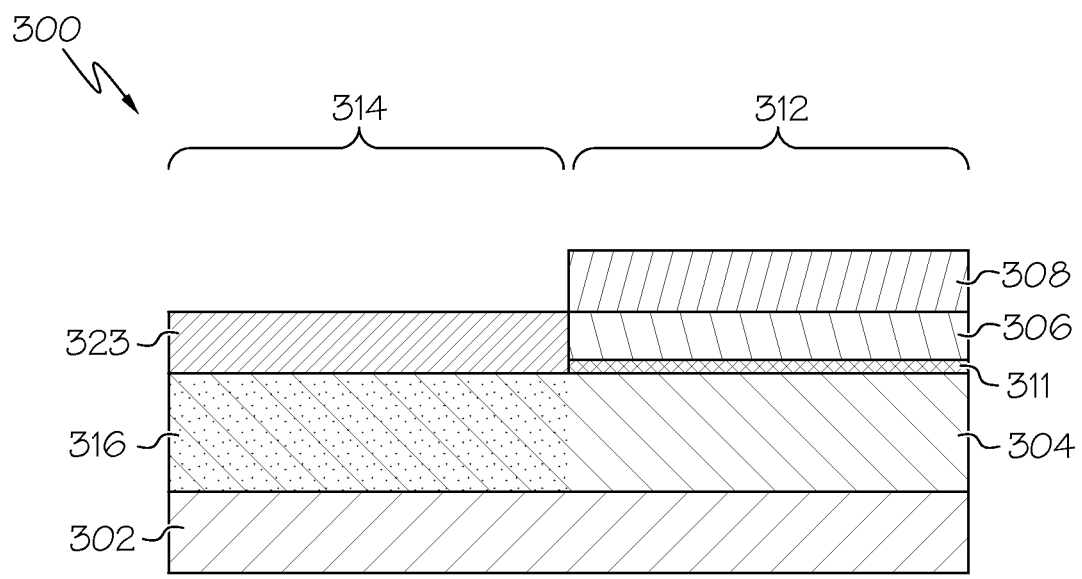
Figure 3E:
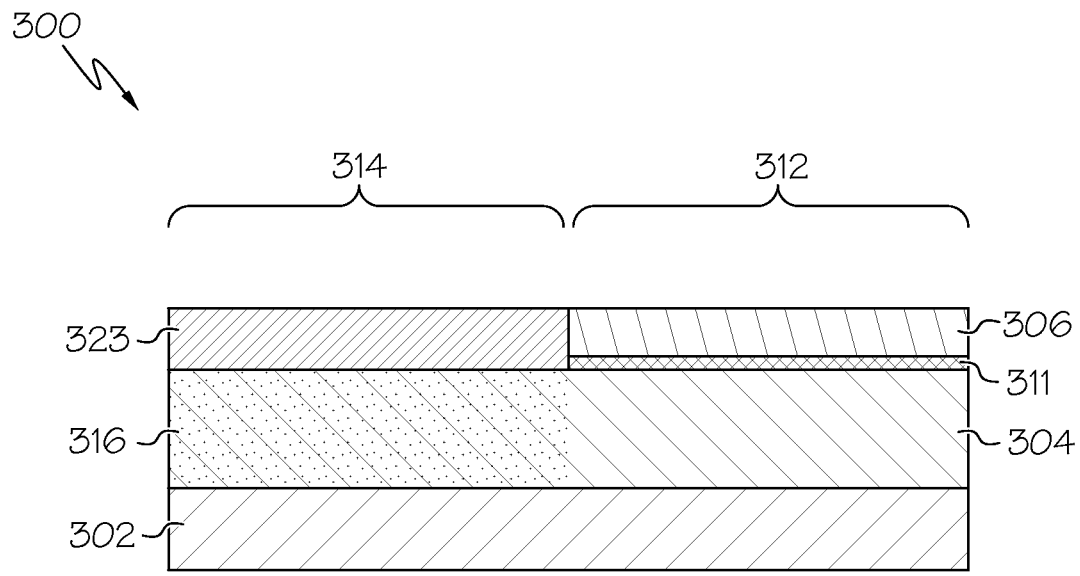

FIG. 3D shows semiconductor structure 300 after a subsequent process step of removing the photoresist 310, and depositing another silicon germanium layer 323. Silicon germanium layer 323 has a higher germanium concentration than SRB 304. In embodiments, the percentage of germanium for silicon germanium layer 323 may range from about 20 to about 40 percent higher than that of the SRB. FIG. 3E shows structure 300 after a subsequent process step of removing the hardmask 308.

Figure 3F:
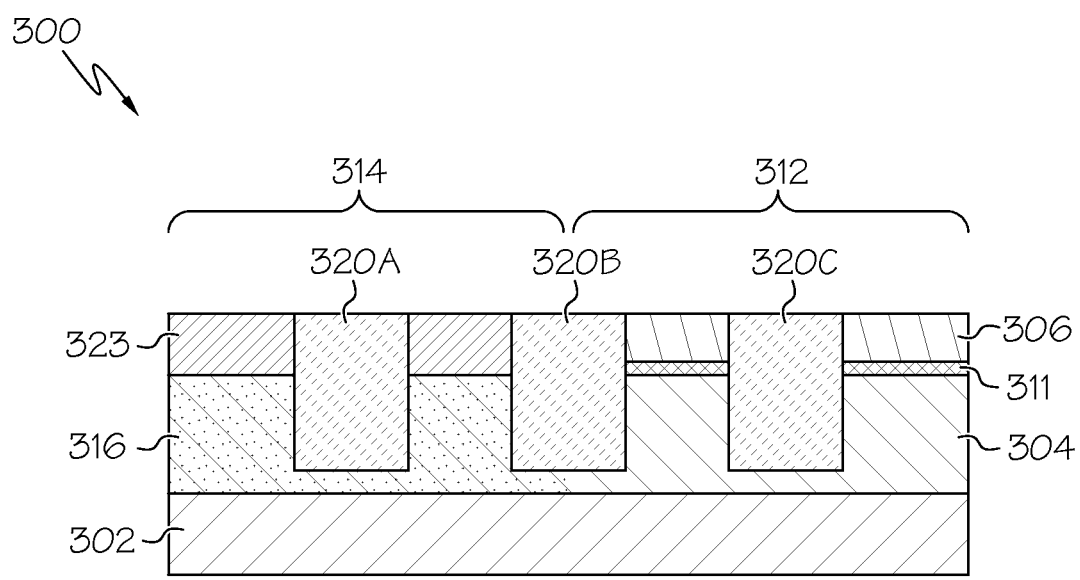

FIG. 3F shows semiconductor structure 300 after subsequent process steps of patterning shallow trench cavities, and filling the shallow trench cavities with a dielectric layer to form shallow trench isolation (STI) regions 320A, 320B, and 320C. The STI regions serve to provide isolation for adjacent devices. The thin layer of silicon germanium 311 in the first region 312 serves as a quantum barrier layer to improve the carrier confinement to the silicon channel within layer 306 for nFET devices. Optionally, dopant diffusion barriers, such as the addition of carbon atoms near the top of the SRB 304 may be used. From this point forward, industry standard techniques may be used to form an integrated circuit. These techniques may include sidewall image transfer (SIT) techniques or other advanced patterning techniques to form fins, replacement metal gate (RMG) techniques to form gates, back end of line (BEOL) steps to provide via and metallization connectivity, and packaging.

Figure 4A:
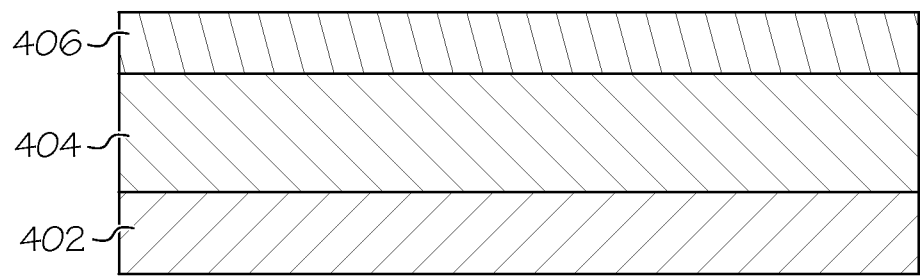

FIGS. 4A-4D show process steps for forming a semiconductor structure having a strain relaxed buffer in accordance with additional embodiments of the present invention. Referring now to FIG. 4A, a semiconductor structure 400 at a starting point for embodiments of the present invention is shown. Semiconductor structure 400 comprises a semiconductor substrate 402. In embodiments, semiconductor substrate 402 may comprise a bulk silicon substrate such as a silicon wafer. Disposed on substrate 402 is strain relaxed buffer (SRB) 404. In embodiments, SRB 404 is comprised of silicon germanium (SiGe). In embodiments, the percentage of germanium for SRB 404 may range from about 15 percent to about 75 percent, and more preferably between about 20 and about 50 percent. In embodiments, SRB 404 is doped with either n type or p type dopants. Disposed on the SRB 404 is another silicon layer 406.

Figure 4B:
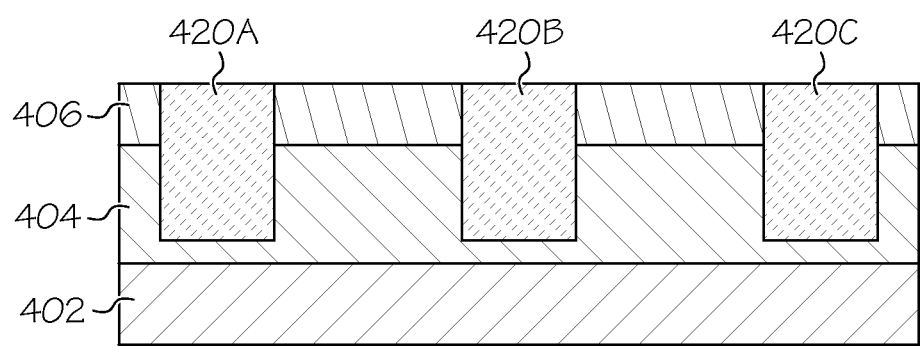

FIG. 4B shows semiconductor structure 400 after subsequent process steps of patterning shallow trench cavities, and filling the shallow trench cavities with a dielectric layer to form shallow trench isolation (STI) regions 420A, 420B, and 420C. The STI regions serve to provide isolation for adjacent devices. In embodiments, the STI regions 420A, 420B, and 420C are comprised of silicon oxide.

Figure 4C:
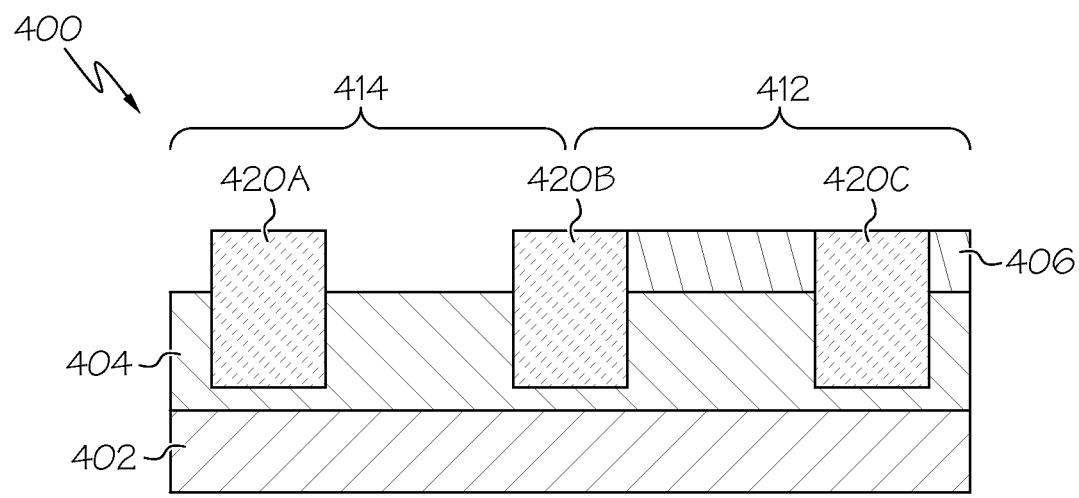

FIG. 4C shows semiconductor structure 400 after subsequent process steps of patterning the structure 400 into two regions, a first region 412 and a second region 414. This may be performed using industry-standard lithographic and etching techniques. A portion of the silicon layer 406 is removed from the second region 414. The removal of the portion of the silicon layer 406 from region 414 is performed using a selective process that does not remove the STI regions 420A, 420B, and 420C. Following this removal of a portion of the silicon layer 406, a counterdoping step using the opposite doping polarity as that used for originally for the SRB. This is then followed by removal of any patterning layer(s).

Figure 4D:
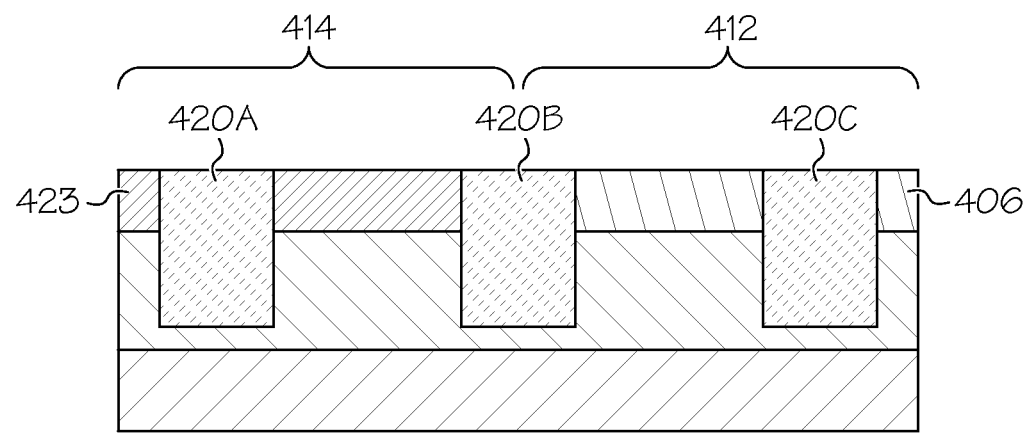

FIG. 4D shows semiconductor structure 400 after a subsequent process step of depositing a second silicon germanium layer 423. In embodiments, silicon germanium layer 423 has a higher germanium concentration than SRB 404. In embodiments, the percentage of germanium for silicon germanium layer 423 may range from about 20 to about 40 percent higher than that of the SRB. From this point forward, industry standard techniques may be used to form an integrated circuit. These techniques may include sidewall image transfer (SIT) techniques or other advanced patterning techniques to form fins, replacement metal gate (RMG) techniques to form gates, back end of line (BEOL) steps to provide via and metallization connectivity, and packaging.

Figure 5A:
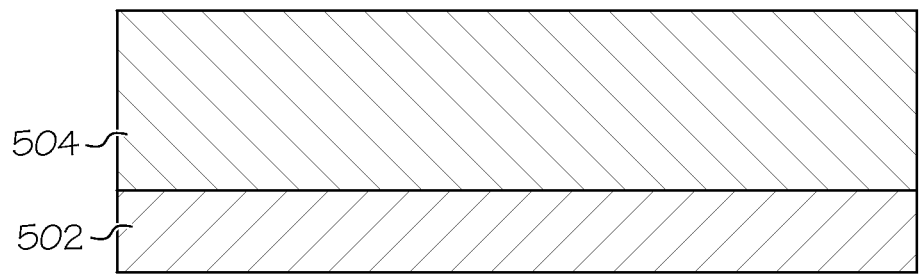

FIGS. 5A-5F show process steps for forming a semiconductor structure having a strain relaxed buffer in accordance with additional embodiments of the present invention. Referring now to FIG. 5A, a semiconductor structure 500 at a starting point for embodiments of the present invention is shown. Semiconductor structure 500 comprises a semiconductor substrate 502. In embodiments, semiconductor substrate 502 may comprise a bulk silicon substrate such as a silicon wafer. Disposed on substrate 502 is strain relaxed buffer (SRB) 504. In embodiments, the percentage of germanium for SRB 504 may range from about 15 percent to about 75 percent, and more preferably between about 20 and about 50 percent. In embodiments, SRB 504 is doped with either n type or p type dopants.

Figure 5B:
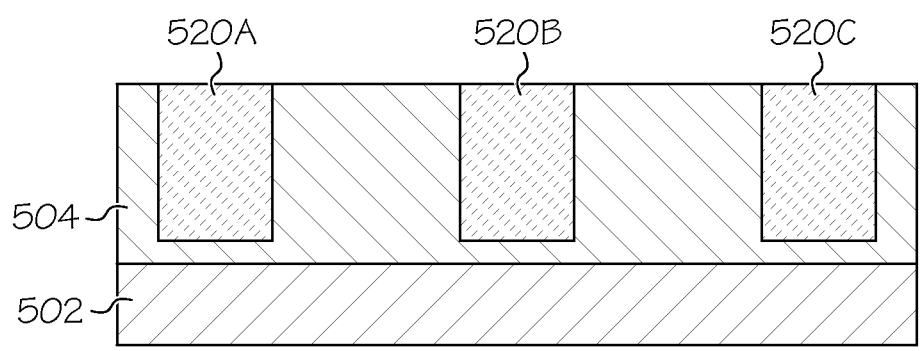

FIG. 5B shows semiconductor structure 500 after subsequent process steps of patterning shallow trench cavities, and filling the shallow trench cavities with a dielectric layer to form shallow trench isolation (STI) regions 520A, 520B, and 520C. The STI regions serve to provide isolation for adjacent devices. In embodiments, the STI regions 520A, 520B, and 520C are comprised of silicon oxide.

Figure 5C:
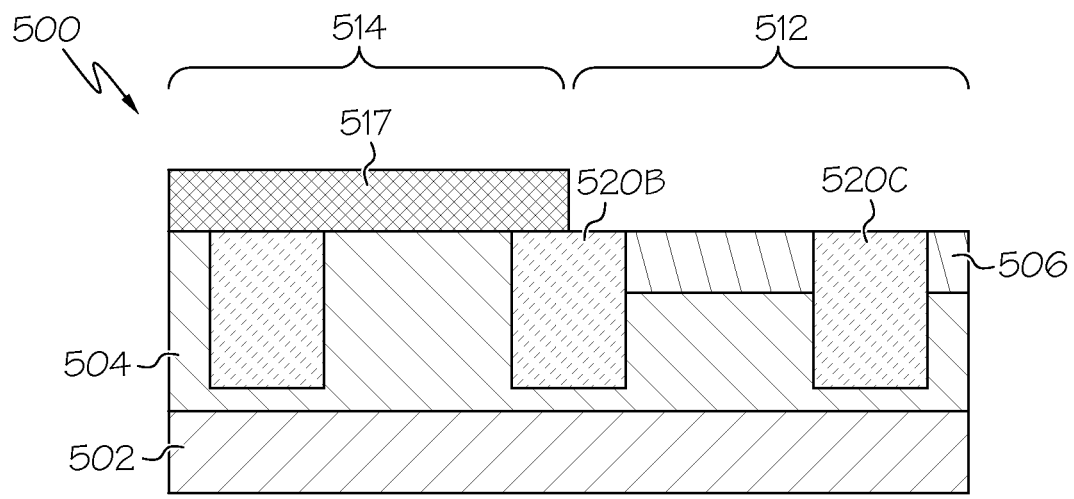
Figure 5D:
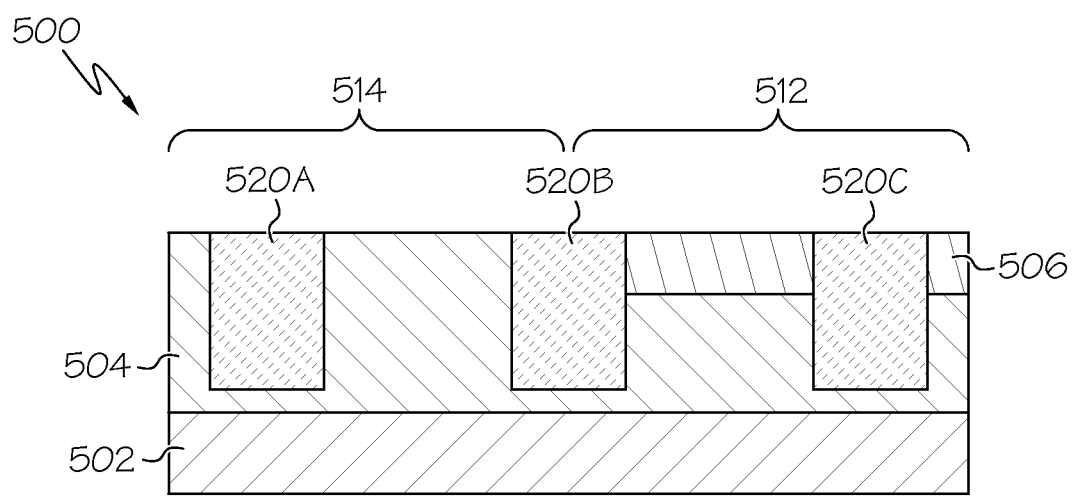

FIG. 5C shows semiconductor structure 500 after subsequent process steps of patterning the structure 500 into two regions, a first region 512 and a second region 514. A pad layer 517 is thus formed on the structure 500 in the second region 514. This may be performed using industry-standard lithographic and etching techniques. With the pad layer 517 in place, the SRB 504 is selectively recessed in the first region 512, such that the STI regions 520B and 520C are not removed during this recess. A silicon layer 506 is then deposited in first region 512. FIG. 5D shows semiconductor structure 500 after the removal of pad layer 517.

Figure 5E:
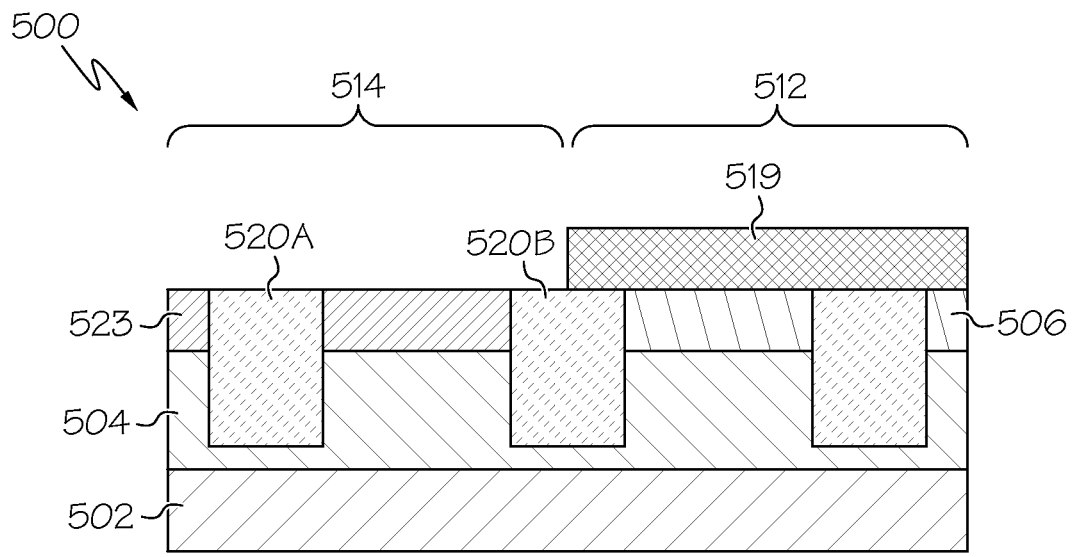
Figure 5F:
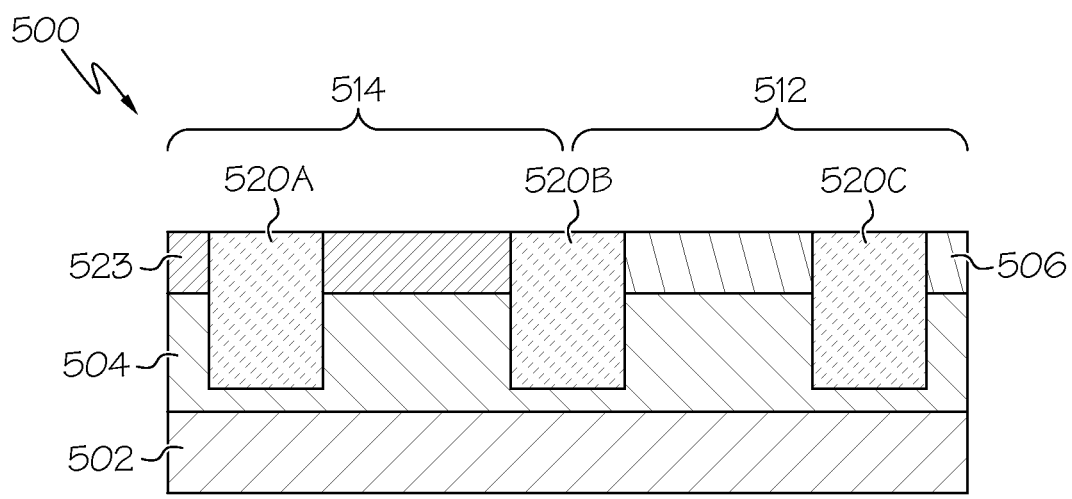

FIG. 5E shows semiconductor structure 500 after a subsequent process of forming a pad layer on the structure 500 in the first region 512. This may be performed using industry-standard lithographic and etching techniques. With the pad layer 519 in place, the SRB 504 is selectively recessed in the second region 514, such that the STI regions 520A and 520B are not removed during this recess. A silicon germanium layer 523 is then deposited in second region 514. In embodiments, silicon germanium layer 523 has a higher germanium concentration than SRB 504. In embodiments, the percentage of germanium for silicon germanium layer 523 may range from about 20 to about 40 percent higher than that of the SRB. FIG. 5F shows semiconductor structure 500 after the removal of pad layer 519. From this point forward, industry standard techniques may be used to form an integrated circuit. These techniques may include sidewall image transfer (SIT) techniques or other advanced patterning techniques to form fins, replacement metal gate (RMG) techniques to form gates, back end of line (BEOL) steps to provide via and metallization connectivity, and packaging.

Note that throughout this disclosure, exemplary germanium concentration ranges are disclosed for the SRB and other SiGe layers. These are exemplary, and other concentration ranges are possible and within the scope of embodiments of the present invention. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, comprising:

forming an n-doped, stress relaxed epitaxial first silicon germanium layer having a first germanium concentration onto a semiconductor substrate;

depositing a compressively strained epitaxial second silicon germanium layer having a second germanium concentration onto the first silicon germanium layer, wherein the second germanium concentration is higher than the first germanium concentration;

removing a portion of the second silicon germanium layer over a first region to create exposed regions of the first silicon germanium layer, thereby forming a preserved portion of the second silicon germanium layer over a second region;

counterdoping to p-type the exposed regions of the first silicon germanium layer that are not covered by the second silicon germanium layer;

selectively depositing a tensile strained, epitaxial silicon layer in the first region; and forming a plurality of shallow trench isolation regions in the first region and the second region of the second silicon germanium layer.

2. The method of claim 1, wherein depositing a first silicon germanium layer comprises depositing a silicon germanium layer with a first germanium concentration ranging from about 20 percent to about 50 percent.

3. The method of claim 2, wherein depositing a second silicon germanium layer comprises depositing a silicon germanium layer with a second germanium concentration ranging from about 20 percent to about 40 percent higher than the first germanium concentration.

4. The method of claim 1, wherein forming a plurality of shallow trench isolation regions comprises forming silicon oxide regions that extend into the first silicon germanium layer.

5. The method of claim 1, wherein forming a first silicon germanium layer having a first germanium concentration onto a silicon substrate comprises depositing a silicon germanium layer that is in-situ doped with N-type dopants comprising phosphorous, arsenic, and/or antimony and having a first dopant concentration.

6. The method of claim 5, further comprising:
covering the preserved portion of the second silicon germanium layer with a hardmask layer; and
doping by ion implantation a portion of the first silicon germanium layer with P-type dopants comprising boron to a second dopant concentration that is higher than the first dopant concentration.

7. A method of forming a semiconductor structure, comprising:
forming a stress relaxed epitaxial first silicon germanium layer doped with a first dopant species and having a first germanium concentration onto a semiconductor substrate;
depositing a second silicon germanium layer on the first silicon germanium layer and having a second germanium concentration;
forming shallow trench isolation regions in the first and second silicon germanium layers;
removing a portion of the second silicon germanium layer over a first region to create exposed regions of the first silicon germanium layer, while preserving a portion of the second silicon germanium layer over a second region;
counterdoping the exposed regions of the first silicon germanium layer that are not covered by the second silicon germanium layer with dopants opposite in polarity to the first dopant species; and
depositing a third silicon germanium layer over the first silicon germanium layer in the first region and having a third germanium concentration.

8. The method of claim 7, wherein depositing a first silicon germanium layer comprises depositing a silicon germanium layer with a first germanium concentration ranging from about 20 percent to about 50 percent.

9. The method of claim 7, wherein
the first dopant species is boron and has a first dopant concentration;
the second silicon germanium layer has a germanium concentration ranging from 0 to 1%;
the counterdoping of the exposed regions of the first silicon germanium layer that are not covered by the second silicon germanium layer is selected from the group consisting of arsenic, phosphorus, and antimony and has a dopant concentration higher than that of the first dopant concentration; and
the third germanium concentration ranges from about 20 percent to about 40 percent higher than the first germanium concentration.

10. The method of claim 7, wherein
the first dopant species is selected from the group consisting of arsenic, phosphorus, and antimony and has a first dopant concentration;
the second germanium concentration ranges from about 20 percent to about 40 percent higher than the first germanium concentration;
the counterdoping of the exposed regions of the first silicon germanium layer that are not covered by the second silicon germanium layer is comprised of boron and has a dopant concentration higher than that of the first dopant concentration; and
the third silicon germanium layer has a germanium concentration ranging from 0 to 1 percent.

11. The method of claim 7, wherein forming a plurality of shallow trench isolation regions comprises forming silicon oxide regions that extend into the first silicon germanium layer.

* * * * *